(12) United States Patent
Johnson et al.

(10) Patent No.: US 6,559,601 B1
(45) Date of Patent: May 6, 2003

(54) PLASMA VACUUM PUMP

(75) Inventors: Wayne L. Johnson, Phoenix, AZ (US); Raphael A. Dandl, San Marcos, CA (US); Gareth E. Guest, La Jolla, CA (US)

(73) Assignees: Tokyo Electron Limited, Tokyo (JP); James P. Gallagher, Scottsdale, AZ (US)

( * ) Notice: Subject to any disclaimer, the term of this patent is extended or adjusted under 35 U.S.C. 154(b) by 0 days.

(21) Appl. No.: 09/869,766
(22) PCT Filed: Dec. 10, 1999
(86) PCT No.: PCT/US99/27927
§ 371 (c)(1), (2), (4) Date: Jul. 2, 2001
(87) PCT Pub. No.: WO00/41445
PCT Pub. Date: Jul. 13, 2000

Related U.S. Application Data
(60) Provisional application No. 60/114,453, filed on Dec. 30, 1998.

(51) Int. Cl.$^7$ .............................................. F04B 37/02
(52) U.S. Cl. .......................... 315/111.71; 315/111.81; 417/48; 417/50
(58) Field of Search ........................ 315/111.71, 111.81; 417/48, 49, 50

(56) References Cited

U.S. PATENT DOCUMENTS

| | | | |
|---|---|---|---|
| 3,746,474 A | * | 7/1973 | Lloyd ............................ 417/49 |
| 5,581,156 A | | 12/1996 | Roberts et al. |

* cited by examiner

*Primary Examiner*—David Vu
(74) *Attorney, Agent, or Firm*—Pillsbury Winthrop LLP

(57) ABSTRACT

A plasma pump and method for pumping ions from a first to second region, the pump including a partition member having a through opening defining a plurality of conduits (30); a group of magnets (24) to provide magnetic forces that extend to the conduits; and a plurality of electric potential sources (14) for creating electrostatic fields which accelerate ions from the conduits to the second region.

29 Claims, 4 Drawing Sheets

PLASMA VACUUM PUMP

This application is the National Phase of International Application PCT/US99/27927 filed Dec. 10, 1999 which designated the U.S. and that International Application was published under PCT Article 21(2) in English. This application also claims priority from provisional application No. 60/114,453 filed Dec. 30, 1998.

BACKGROUND OF THE INVENTION

The present invention relates to systems for maintaining extremely low gas pressures during execution of industrial and scientific processes, particularly in regions which are continuously receiving a fresh supply of gas.

Many types of industrial and scientific processes are performed in a processing region which is evacuated to a very low pressure, of the order of several milliTorr (mT). Processes of this type include deposition and etching operations performed on semiconductor wafers with the aid of a plasma. In systems for carrying out such processes, a plasma is generated in a processing region which contains a processing gas maintained at a low pressure in the range of 1–100 mT, and frequently less than 10 mT. The gas will be ionized in the plasma and the resulting ions can be accelerated toward the wafer by suitable electric fields. During the course of the process, processing gas must be pumped out of the region at a high rate with a minimum of contamination by foreign materials, such as oil, that may be contained in the pumping equipment, and materials resulting from the processing itself, while fresh processing gas is supplied to the region.

In most processes of this type, the processing rate is dependent, inter alia, on the throughput, or rate of flow of processing gas molecules into and out of the processing region. This throughput, in turn, depends upon pumping speed and the fluid flow conductance between the processing region and the pump. The cost of processing a substrate is, in general, inversely proportional to the processing gas throughput.

The conventional technology employed to create low pressure levels of the order indicated above generally utilizes either one of the following two fundamental mechanisms: (1) increasing the momentum of gas molecules (hereinafter, references to "molecules" will be understood to encompass both atoms and molecules in those contexts where reference to both types of particles would be more technically correct) in a preferred direction and exhausting the gas through a valve or a baffle structure which inhibits reverse flow of gas; or (2) condensing the gas on specially prepared surfaces. Mechanism (1) is usually implemented with some type of piston, blower, or rapidly moving vanes which impart directed momentum to the gas by employing rapidly moving mechanical structures or streams of pumping molecules, such as molecules of mercury or readily condensable pumping oils. Mechanism (2) is commonly used in systems with low to moderate throughput requirements.

Turbomolecular pumps utilize mechanism (1) and are provided with rapidly spinning discs which impart directed momentum to gas molecules by colliding with those molecules. This mechanism is most effective for gas pressures which are sufficiently low that the mean-free-path of the molecules is longer than the dimensions of the pumping structures.

To establish low pump inlet pressures, of the order of 1–100 mT, employed in industrial plasma processes, it is presently the nearly universal practice to employ turbomolecular pumps as the first stage of a compound pumping system intended to pump large quantities of processing gas.

It has been found that the quality of processing operations of the type described above, and thus the quality of the finished semiconductor device, is dependent in large measure on the purity and composition of the processing gas and that these parameters can best be controlled if the flow rate of fresh gas into the processing enclosure is relatively high. The quality of the results produced by plasma assisted etching and deposition processes could be significantly enhanced if the gas throughput could be increased to a level between 3 and 5 times that presently utilized.

Although there are currently available high speed turbomolecular pumps which can achieve throughputs of the order of 5500 liters per second, at low inlet pressures, the highest capacity pumps that are currently available are also extremely expensive, as well as being less reliable than smaller pumps.

Moreover, even a throughput of 5500 liters per second has been found to be less than the optimum value for performing processes on wafers having a diameter of 200 mm, while achievement of optimum processing results on larger diameter wafers would require even higher gas throughputs. In general terms, the gas throughput required to achieve a certain processing result in terms of quality is proportional to the area of the substrate.

In addition, effective control of gas flow must allow for gas species that have a tendency to become attached to solid surfaces within the system. Such species include, for example, carbon compounds that are polymerized either by electrons or protons in the plasma. A plasma electron or proton flux can easily affix such materials to solid surfaces. Such materials may be subsequently released from the surfaces, perhaps in a modified form. The quality of any plasma assisted process of the type described above is dependent on the extent to which polymerized or otherwise modified materials can be prevented from being deposited on the substrate surface and this, in turn, depends on the extent to which such materials can be prevented from forming and/or remaining in the processing region.

Gas molecules which remain in the processing region for any significant time can be deposited on the substrate in a chemical form which is resistant to subsequent etching processes. As a result, these molecules will form defects on the substrate surface. The plasma pumping process can be greatly simplified if the concentration of organic and etching products in the gas phase can be made insignificantly small.

In view of the possible occurrence of such phenomena, it is apparent that the shorter the residence time of gas molecules in the processing region, the higher will be the quality of the product resulting from a series of etching and/or deposition processes.

In addition to the vacuum pumping technologies that have been used in connection with processing operations of the type described above, pumps using a plasma as an active element have been proposed. Plasma vacuum pumps would be capable of pumping a variety of gasses, including hydrogen and helium, with relatively high efficiencies, and are relatively immune to damage by solid or corrosive materials.

The operation of plasma vacuum pumps involves transforming three-dimensional flow of a neutral gas into one-dimensional flow guided by a magnetized plasma which may be magnetically compressed and guided through suitable baffle structures. Momentum can be imparted to the plasma as a result of various electromagnetic interactions and can be imparted to the neutral gas through collisions between molecules of the neutral gas and moving ions which have been accelerated and have greater momentum than background gas.

However, the potential benefits of using plasma vacuum pumps in plasma processing systems has not heretofore been realized to any significant extent. in particular, no solution has been proposed which combines efficient plasma generation with the creation of magnetic fields compatible with the plasma processing operation to be performed and suitable for channeling the plasma, as well as with a suitable mechanism for effecting pumping at pressures in the range which is of importance in such plasma processing operations.

The possibility of employing plasma vacuum pumping in plasma processing systems has been described, for example, in U.S. Pat. No. 4,641,060, which is issued to Dandl on Feb. 3, 1987. This patent discloses a plasma vacuum pump which does not employ any moving mechanical parts and which is capable of producing high pumping rates at gas pressures of less than 1 mT. A primary mechanism underlying this plasma vacuum pump is a magnetically guided flow of plasma ions and electrons through simple tubular baffle structures that restrict the flow of neutral gas molecules back into the region which is to be maintained at a low pressure. The pump disclosed in this patent appears capable of functioning effectively with magnetized plasmas at pressures below an upper limit determined by the spontaneous formation of electrostatic potentials that block the flow of plasma ions. "Magnetized plasmas" as used herein is a plasma in which the electron flow is magnetized, i.e., the electrons circulate around the magnetic field lines. While this form of plasma vacuum pump may prove suitable for some low pressure, magnetically confined plasma applications, it does not appear to be particularly suitable for typical industrial plasma processing systems.

BRIEF SUMMARY OF THE INVENTION

It is an object of the present invention to pump ions out of a low pressure region at a high rate.

Another object of the invention is to provide a pumping system capable of achieving high pumping rates at a low cost.

A further object of the invention is to permit electrical control of the rate at which ions are pumped.

A still further object of the invention to effect ion pumping in a manner which promotes uniformity of processing across the surface of the substrate.

Yet another object of the invention is to control the profile, or distribution, in planes parallel to the substrate surface, of the speed at which ions are pumped above and around the substrate.

A further object of this invention is to use a plasma pump composed of an array of pumping cells to adjust the pumping speed and/or control processing region pressure with high response rates.

The above and other objects are achieved, according to the invention, by the provision of a novel plasma vacuum pump and pumping method for pumping ions from a first region, the ions possibly being generated by a plasma in the first region, to a second region when the plasma pumping cell is interposed between those regions. The plasma vacuum pump is constituted by: a partition member positionable between the first region and the second region, the partition member defining a plurality of conduits between the first and second regions; a source of free electrons in communication with the conduits; a plurality of groups of magnets, each group being positioned relative to a respective one of the conduits in a manner to provide lines of magnetic force that extend through the respective one of said conduits; and a plurality of electric potential sources, each source being disposed relative to a respective one of the conduits to create an electrostatic field which accelerates ions from the respective one of said conduits to the second region, wherein each of the conduits, together with a respective group of magnets and a respective electric potential source, forms a respective one of a plurality of pumping cells.

The magnetic fields produced by the magnets essentially influence the radial distribution of ions in the conduits and acts to trap electrons in the conduit. The trapped electrons act to prevent a positive space charge from developing within the conduits and give rise to electrostatic fields which accelerate positive ions from the first region into the conduits. While passing through the conduits, a certain proportion of the positive ions will combine with electrons to form neutral molecules. These neutral molecules will be carried by momentum into the second region. Ions which have not combined with electrons will be carried into the second chamber by momentum and the electrostatic field produced by the potential source.

The plasma in the first region, which may be the process plasma, ionizes a gas which has been introduced into that region, producing electrons that are magnetized and ions that are typically employed to carry out the process and that are to be pumped out of the first region so that a fresh supply of ions will be maintained in that region. The effect of the plasma on the electrons is to create a space charge that affects ion motion. According to one novel feature of the invention, the ions in the first region are given some directed energy, by the plasma and this directed energy aids the pumping action.

According to a further novel aspect of the present invention, the pumping cells are positioned relative to the processing region in a manner to increase the efficiency with which ions can be pumped out of that region. Preferably, the cells are disposed close to the plasma in the processing region so that use can be made of the highest possible plasma density to improve pumping efficiency. This configuration allows the average time that gas molecules remain in the processing region to be made extremely short.

A plasma vacuum pump composed of a plurality of cells according to the present invention may be disposed in a processing chamber which contains a substrate to be processed. It is desirable that the partition wall which carries the plurality of cells have an area which is as large as possible in order to increase the pumping rate and thus reduce the residence time of gas molecules in the chamber. However, this should be accomplished without significantly increasing the volume of the processing chamber since the residence time of gas in the processing chamber will increase as the chamber volume increases.

When the ions to be pumped have been generated in a plasma, ions adjacent the boundary of the plasma region will be influenced by the plasma sheath and ions in the vicinity of the pumping cells will experience some pre-sheath motion toward the cells. These ions will then be attracted into the cell conduits by the electrostatic fields created by electrons trapped in the conduits. The intensity of these electrostatic fields is determined essentially by the ambient ion and electron densities and the electric fields produced by the electric potential sources. The electrostatic fields extend through the conduits and act to accelerate ions from the first region, near the partition member, into the conduits.

In addition, momentum will be imparted to un-ionized gas molecules in the chamber by ions of gas molecules that have just entered the chamber and have a low, finite level of directed energy. Collisions between these ions and neutral species of exactly the same molecular structure and weight results in a very efficient, or resonant, transfer of energy. The efficiency of the transfer is inversely proportional to the speed of the faster one of the two colliding particles.

Gas molecules which are to be pumped need not be transported through any transitional structure in order to be removed from the system. In fact, processing gas molecules which have been injected into the processing region, or chamber, and which have not yet been ionized, will naturally travel in one of the following two possible ways:

(a) the more probable behavior of the molecules will be to bounce off of the surface of the substrate being processed and to be reflected in a cosine distribution about a normal to the substrate surface. The breadth of this distribution depends upon the fine surface features of the substrate;

(b) otherwise, the molecules may be adsorbed on the surface of the substrate and will then be re-emitted sometime later, possibly after having been converted to a different species having a different molecular weight. Such re-emission is also associated with a cosine distribution about the normal to the substrate surface.

The above-mentioned cosine distributions describe the pattern in which molecules are reflected or re-emitted in different directions from the substrate surface. The intensity, or quantity, of molecules emitted in each direction is proportional to the cosine of the angle formed between the direction and the substrate surface, which means that the intensity, or quantity, of emitted electrons will be greatest in the direction perpendicular to the substrate surface.

Control of gas flows within the processing chamber is enhanced if gas is introduced into the chamber in such a manner as to be propelled directly toward the substrate surface and if most molecules which have bounced off of the substrate surface are removed from the processing chamber by the vacuum pump after the first bounce off of the substrate surface. A simple calculation of molecular speed indicates that effective use of the kinetic energy of molecules to be removed requires that the number of bounces, or reflections, experienced by the molecules be minimized. To the extent that gas molecules can be pumped out of the processing chamber immediately after having bounced off the substrate surface, collisions with surfaces within the processing chamber can be minimized. Such minimization is advantageous because molecules which strike such surfaces may become attached thereto, and may subsequently be returned to the substrate surface in an altered form. Therefore, rapid removal of gas molecules allows the process being performed on the substrate to be controlled in a superior manner.

In order to affect ionized gas throughput, the electric field within each pumping conduit may be modulated so as to change the local accelerating field. This may be achieved by modulating the potential of each of the electric potential sources either individually or in groups, or by identically modulating the potentials of all of the electric potential sources. Adjustment of the plurality of cells making up the plasma pump in one of these ways may allow modulating the bulk pressure within the plasma chamber on a short time scale. The time scale for pumping response is directly related to the ion transit time which may be several microseconds to several milliseconds depending upon the transit distance through the pumping conduit. Since there are no moving parts within the pump (e.g., a gate valve that is typically used to control pressure), the time response is significantly improved over conventional pumping systems.

The pumping cells may be individually adjusted to affect the spatial distribution of the pressure, or pumping, field. The spatial distribution of pressure may also be controlled by appropriate design of the geometry and/or placement of the individual pumping cells. Specifically, the cells can be distributed in a nonuniform manner across the partition member.

DETAILED DESCRIPTION OF THE INVENTION

Figure 1:
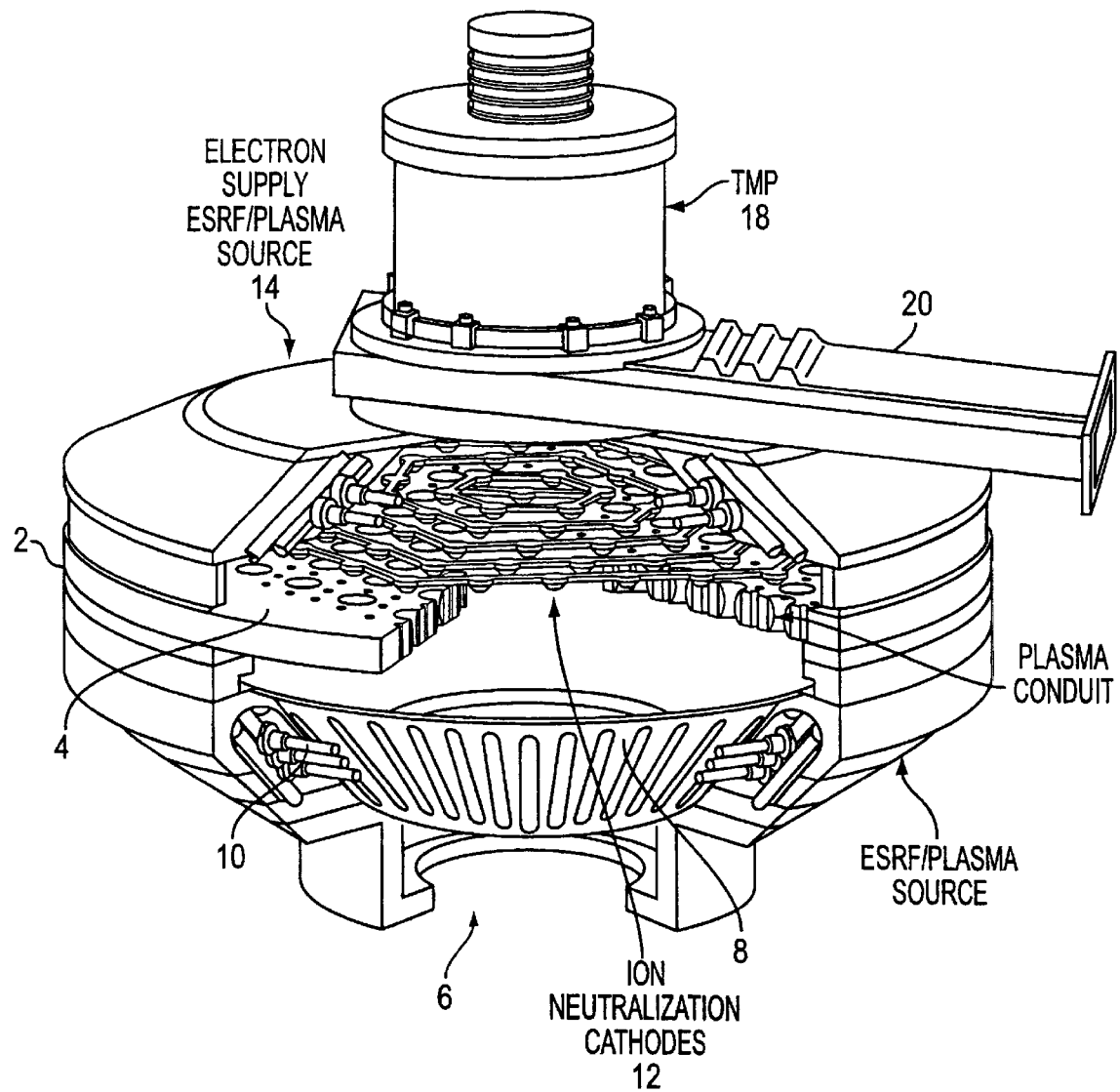
FIG. 1 is a perspective view of a processing chamber equipped with a pump according to the present invention composed of a plurality of plasma vacuum pumping cells.

As an aid to understanding the invention, a rudimentary, highly idealized model of a basic pumping cell of a plasma vacuum pump will be described prior to the description of preferred embodiments. This cell may be of the typed disclosed in Provisional U.S. Application No. P-99,082, filed on Jul. 1, 1998, the contents of which are incorporated herein by reference.

A pump according to the invention can be visualized as being composed of an inlet chamber, or space, and an outlet chamber, or space, connected to the inlet chamber by a conduit, or baffle. Gas flows into the pump via a gas inlet connected to the inlet chamber and out of the pump via a gas outlet connected to the outlet chamber. The following parameters are used to describe the operation of the pump:

$Q_{in}$=gas flow rate into the inlet chamber via the gas inlet;

$Q_p$=ion flow rate from the inlet chamber to the outlet chamber;

$Q_b$=neutral gas reverse flow rate from the outlet chamber to the inlet chamber;

$Q_{out}$=gas flow rate out of the outlet chamber via the gas outlet;

$p_{in}$=the pressure in the inlet chamber;

$p_{out}$=the pressure in the outlet chamber;

$A_p$=the effective aperture, or area, of the baffle with respect to plasma ions;

$A_b$=the physical aperture, or area, of the baffle;

$F(A_b)$=the effective conductance of the baffle structure, which is dependent on the physical form of the baffle and gas pressure;

R=the effective compression ratio achieved by the pump;

$n_i$=the density of plasma ions in the inlet chamber; and $c_s$=the ion sound speed of ions in the inlet chamber, determined primarily by electron temperature, or energy.

The equations set forth below assume consistent units of measure for the various parameters.

The inlet gas flow rate, $Q_{in}$, is exactly equal to the outlet flow rate, $Q_{out}$, in steady state. The latter is determined by the speed, $S_f$, of a fore pump connected to the gas outlet and the pressure, $p_{out}$. Thus:

$$Q_{out}=S_f p_{out}$$

The pressure $p_{out}$ is higher than the pressure $p_{in}$ by the effective compression ratio, R, achieved by the plasma pump:

$$p_{out}=Rp_{in}$$

This compression results from the enhanced flow of plasma ions outward through the baffle relative to the (back) flow of neutral gas. The plasma flow rate, $Q_p$, is given by $$Q_p=n_i c_s A_p$$

The value of $A_p$ depends on the physical aperture as well as the magnetic field shape at the entrance to the baffle.

The rate, $Q_b$, at which neutral gas flows backward through the baffle is given by $$Q_b=F(A_p)(p_{out}-p_{in})$$

This description utilizes the work of Dushman (Saul Dushman, "Scientific Foundations of Vacuum Technique," Second Edition, John Wiley & Sons, New York, 1962; see, in particular, Chapter 2, "Flow of Gases Through Tubes and Orifices") when evaluating the conductance of various baffle structures and generally assumes that the pressure is such that the molecular flow approximation is valid.

Steady-state particle balance requires that the following relations hold:

$$Q_{in}+Q_b=Q_p$$

$$Q_p-Q_b=Q_{out}$$

From the second of these relations we have $$n_i c_s A_p=F(A_b)(p_{out}-p_{in})+S_f p_{out}$$

One can define two dimensionless parameters, X and Y, as follows:

$$X=F(A_b)/S_f$$

$$Y=n_i c_s A_p/[p_{in}F(A_b)]$$

Then $$R=(1+Y)X/(1+X)$$

$$Q_{out}=S_f p_{in}(Y+1)X/1+X \equiv S_f p_{in} YX/1+X (Y>>1)$$

Since the function of X/(1+X) satisfies $0 \leq X/(1+X)<1$ and equals 0.5 when the argument is unity, it is evident that achieving large compression ratios and large throughputs requires large values of Y. This, in turn, requires high plasma densities, substantial ion sound speeds, magnetic fields that make the plasma ion aperture substantially larger than that for neutral gas, low conductance for neutral gas, and low to moderate pressures in the processing chamber. Additionally, the fore pump speed should be comparable to the conductance of the baffle for neutral gas. The quantitative impacts of the several basic principles underlying the operation of the plasma vacuum pump can be seen by using Dushman's model for $F(A_b)$:

$$F(A_b)=0.25v_0 A_b(1+f_{shape})^{-1}$$

Here $v_0$ is the thermal speed of the neutral molecules, and $f_{shape}$ accounts for the effect of the conduit cross sectional shape on its conductance. For simple cylindrical conduits, $$1+f_{shape}=(l/a)[1+3l/8a)]$$

where l and a are the length and inner radius of the cylindrical conduit, respectively.

With these substitutions and carrying out the necessary unit conversions, $$Y=4(n_{ions}/n_0)(c_s/v_0)(A_p/A_b)(1+f_{shape}).$$

Terms not defined herein are defined by Dushman. In a highly ionized plasma it would appear possible to achieve Y>>1 using suitably shaped conduits and suitable magnetic field shapes.

With the above theoretical descriptions in mind, preferred embodiments of the invention will now be described with reference to the drawings.

FIG. 1 is a perspective view of a processing chamber in which a portion of the chamber housing and internal components are broken away in order to permit the viewing of interior details.

The processing chamber includes a multicomponent housing 2 containing a partition wall 4. The outer surface of wall 4 forms a part of the outer wall of housing 2 and extends across the entirety of the chamber to divide the chamber into a lower pressure region, located below partition wall 4, and a higher pressure region, located above partition wall 4.

The lower boundary of the lower pressure region is delimited by a receiving opening 6 for a substrate support (not shown). Before a processing gas is introduced into the chamber, the substrate support carrying a substrate will be displaced upwardly in order to extend into, and seal, opening 6.

The lower pressure region is laterally delimited by an electrostatic shield 8 which serves, in a manner known in the art, to shield a plasma formed within the lower pressure region from interior walls of housing 2. In the structure shown in FIG. 1, electrostatic shield 8 tapers in the downward direction toward opening 6.

The housing wall additionally contains a multiturn coil 10 which will be connected, in a manner known, per se, to an RF power source. When RF current is caused to flow through coil 10, an electromagnetic field will be generated within the lower pressure region. When this electromagnetic field interacts with a processing gas introduced into the lower pressure region, gas molecules will be ionized to create a plasma. The resulting ions will be attracted, under the influence of electric fields established in the chamber according to principles known in the art, to a substrate mounted on the substrate support in order to deposit a layer of material on, or etch material from, the substrate surface.

In the illustrated chamber, the lower pressure region is also referred to as the processing region and gas ions are pumped out of the processing region and into the higher pressure region by means of a plasma vacuum pump according to the present invention composed of pumping cells. The pump is constituted by structures in partition wall 4, an array of nested, annular cathodes 12, and an additional radio frequency plasma source 14 constituted by a multiturn coil mounted within housing 2 above cathodes 12.

The higher pressure region is surmounted by a turbomolecular pump 18 provided, in a manner known in the art, with a gate valve 20 with which conductance can be controlled. Pump 18 serves, in this system, as a second pumping stage, or fore pump. The plasma vacuum pump conveys ions at a high rate from the lower pressure region to the region above partition wall 4, the flow rate being such that the pressure within the region above partition wall 4 is higher than that in the region below partition wall 4. Since a comparatively high pressure exists at the inlet to turbomolecular pump 18, that pump is able to efficiently evacuate gas from the region above partition wall 4 to an outlet region at atmospheric pressure.

Radio frequency plasma source 14 serves to provide a supply of free electrons within the region above partition wall 4. The purpose of these electrons will be described in detail below. In view of the function to be performed by source 14, it could be replaced, in alternative embodiments of the invention, by other sources of free electrons, such as thermionic emitters.

Figure 2:
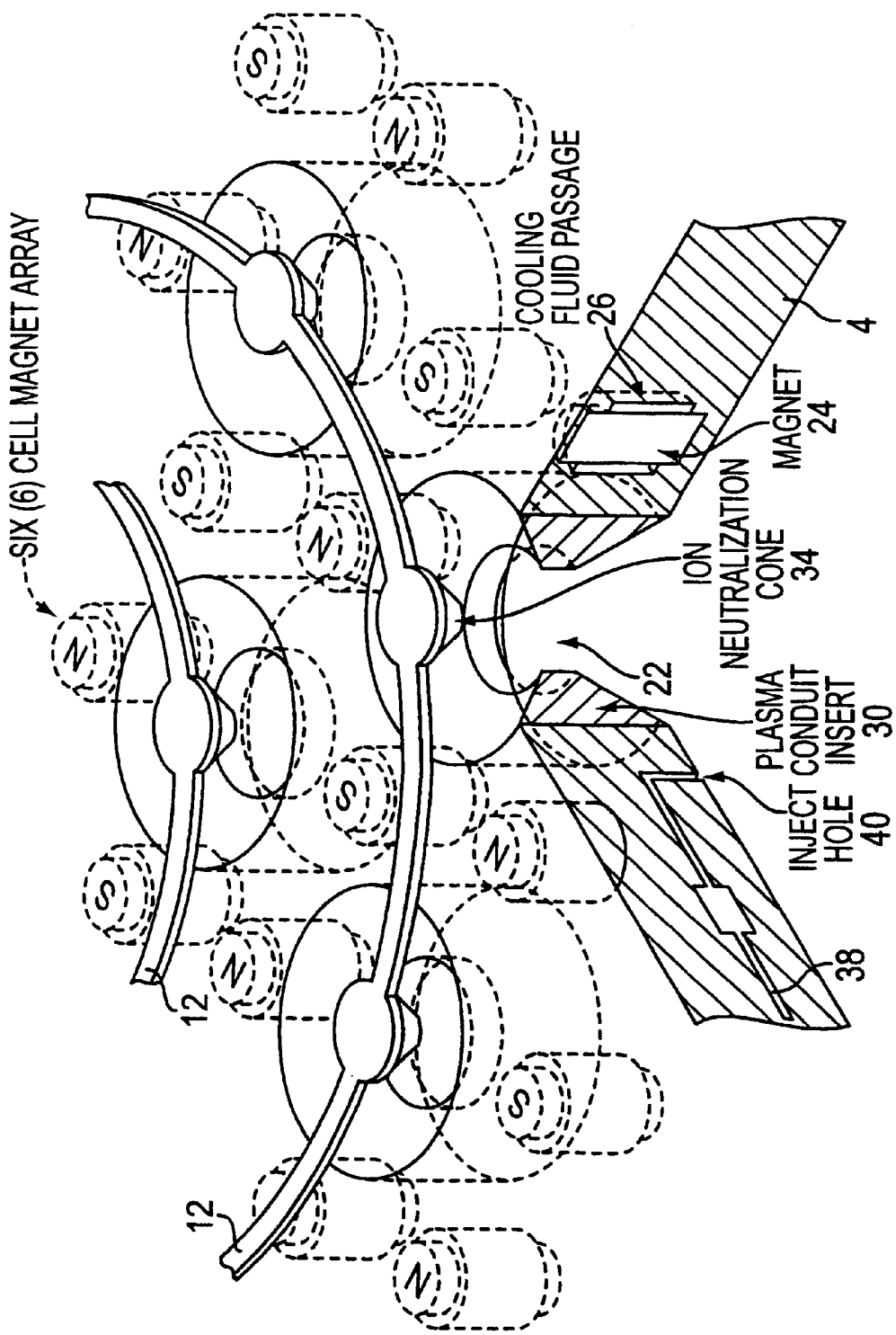
FIGS. 2 and 3 are perspective detail views, partly broken away, showing a portion of the pump illustrated in FIG. 1, as viewed from above and below, respectively.

FIG. 2 is a perspective view showing the basic structure of one embodiment of a pumping cell forming part of a pump according to the invention. FIG. 2, in fact, shows four cells, each cell having a single through opening defining a conduit 22. Conduit 22 is shown to have a circular outline, but other outlines are possible.

Each cell further includes a plurality of magnets 24 surrounding conduit 22. Each magnet 24 has a magnetic axis which extends parallel to the longitudinal axis of its associated conduit 22. Magnets which extend around each conduit 22 alternate in polarity from one magnet 24 to the next around the associated conduit 22.

Preferably, magnets 24 are disposed, and the inner wall of conduit 22 is formed, so that the lines of magnet force which are produced by magnets 24 traverse conduit 22 along paths generally parallel to the surface of conduit 22.

In the embodiment illustrated in FIG. 2, each magnet 24 is a permanent magnet. However, magnets 24 could also, in principle, be electromagnets, which could provide an additional possibility for controlling the pumping process, but will also increase the structural complexity of the pumping cells.

Each magnet 24 is surrounded by an annular cooling fluid passage 26 which will be connected to a cooling fluid source. The cooling fluid passage 26 for each magnet could be individually connected to a cooling fluid source. Alternatively, of course, cooling fluid passages 26 associated with all of the magnets could be interconnected by a network of interconnecting passages which connect all cooling fluid passages 26 in series or in any desired series-parallel pattern.

In the embodiments illustrated herein, partition wall 4 is made of an electrically conductive, nonmagnetic material, such as aluminum. At the location of each cell, partition wall 4 is provided with a circularly cylindrical bore into which is fitted a ceramic insert 30 having the through opening which defines conduit 22. Other bore shapes are possible.

Insert 30 is preferably made of a ceramic material which is a good dielectric, is capable of withstanding high temperatures at least up to 400° C., does not contain any ingredients which might enter the processing chamber and contaminate a substrate, and can be fabricated in a manner that will assure that the resulting insert will not be a source of particulates. Suitable materials include quartz, high purity alumina and high purity titania among others.

In the embodiment illustrated in FIG. 2, each insert 30 is configured so that the boundary wall of conduit 22 has a form represented by the smaller parallel side and the two nonparallel sides of a trapezoid. Other wall shapes may be found to be equally, or more, desirable, including a variety of curved shapes, such as those defining an arc of a circle or a parabola.

The preferred, or optimum, shape for the boundary wall of conduit 22 will depend on a number of factors, including the ion species and nature of the processing operation. For a given installation, the boundary wall shape will be determined empirically with the goal of maximizing net pumping speed. This includes minimizing the effective aperture for reverse flow of gas and maximizing forward gas flow.

Each cell further includes an enlarged portion of a respective cathode 12. The associated enlarged portion has the form of a cone 34 whose axis is aligned with the longitudinal center axis of the associated conduit 22 and whose apex is directed toward the interior of conduit 22. Thus, the wall of cone 34 is concentric with the axis, and with all of the wall portions, of conduit 22. Each cathode 12, and hence each cone 34, is connected to a negative potential source. Preferably, the magnitude of the potential applied to each cathode 12 is individually selected.

It will be noted that in the embodiment illustrated in the FIG. 2, each cell is associated with six magnets 24. However, each magnet is shared by a total of three adjacent cells. When each conduit 22 is surrounded by six magnets, each cell can be identified as a hexapole plasma pumping cell. Embodiments of the invention can be constructed in which each conduit is associated with a different number of magnets, including, for example, a square cell in which each conduit is surrounded by four magnets and an octagonal cell in which each conduit is surrounded by eight magnets. Preferably, however, in order to produce the desired magnet field patterns, each conduit will be surrounded by an even number of magnets.

Depending on the number of magnets which are to surround each conduit 22, the pattern in which the individual cells are distributed across partition wall 4 will preferably be selected to cause maximum sharing of magnets between adjacent cells.

The sharing of magnets 24 among a plurality of adjacent cells reduces the total number of magnets that must be provided and thus reduces fabrication costs. In addition, such an arrangement of magnets allows the individual cells to be placed closer together so that a pump having a given overall diameter can have a larger number of pumping cells and thus a higher pumping rate.

A pump according to the invention will be completed by a source of free electrons above partition wall 4, one such source having been described above with reference to FIG. 1.

The preferred embodiment illustrated in FIG. 2 is completed by a network of channels 38 for introducing an ionizable processing gas into a processing chamber, and specifically into the lower pressure region of the chamber of FIG. 1 that will contain a substrate which is to undergo a fabrication operation.

Figure 3:
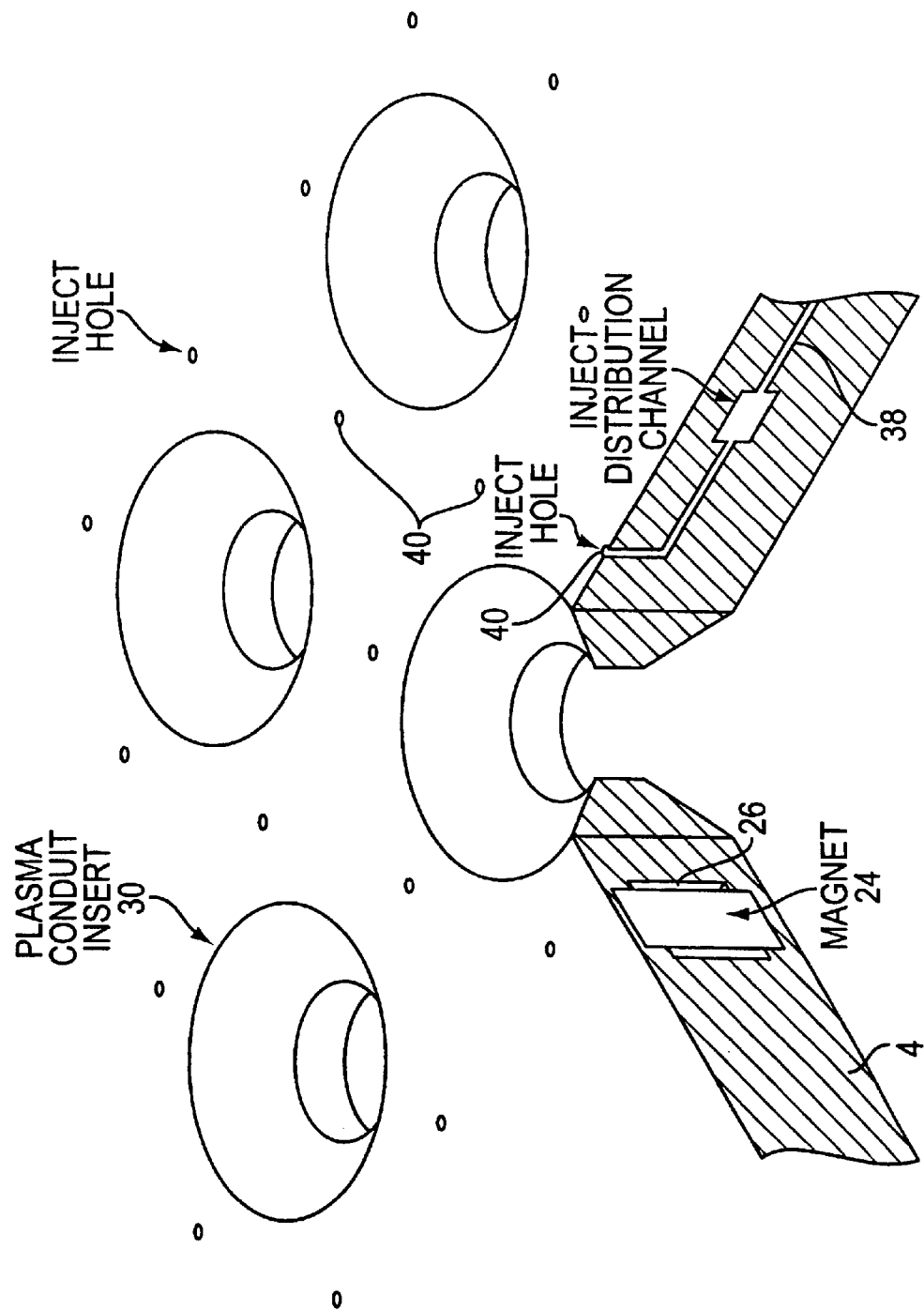

FIG. 3 is a perspective, partly cut-away view showing the side of partition wall 4 which is opposite to that shown in FIG. 2. With respect to the orientation shown in FIG. 1, the top surface of partition wall 4 is shown in FIG. 2 and the bottom surface of partition wall 4 is shown in FIG. 3.

As best seen in FIG. 3, the gas injection network includes a plurality of injection holes, or outlets, 40 distributed in a regular pattern across the bottom surface of partition wall 4. As in the case of the interconnection of cooling fluid passages 26, the network of channels 38 can be interconnected between outlet holes 40 in any suitable pattern.

The outlet ends of passages 38 are oriented to eject processing gas toward a substrate to be treated. The magnetic field produced by an array of magnets as shown particularly in FIG. 2 is characterized by multiple cusps separated by surfaces, known as separatricies, on which the magnetic field strength diminishes to zero. In addition, the magnetic field strength decreases exponentially from the median plane of partition wall 4. The decrease in magnetic field strength with the distance from that plane varies inversely with the number of magnets 24 surrounding each conduit 22. This property of the resulting magnetic fields permits the regions of strong magnetic fields to be localized near the median plane, leaving the main volume in which ions are to be pumped relatively free of steady magnetic fields. The magnetic field strength also vanishes on the central axis of each conduit 22, but increases rapidly in radial directions away from each conduit axis and reaches high values near the wall of each conduit 22.

The cross sectional shape of the walls of each conduit 22 can be made to conform to the shape of the magnetic lines of force extending through the conduit, so that these lines of force will be substantially parallel to the wall surface.

In the equatorial plane of each array of magnets, there can be narrow regions radiating outwardly from the longitudinal axis of the associated conduit 22 in which the magnetic field strength also approaches zero. Radial flow of electrons tends to be unrestricted within these narrow regions, resulting in a loss of electrons and thus a weakening of the electrostatic field within the conduit. These narrow regions have the form of cusps which are located along the mid-line of the magnetic structure, are equiangularly spaced apart around the conduit longitudinal axis and are aligned with angular regions between successive magnets. Such radial flows can be prevented by creation of appropriate electrostatic potentials.

According to a feature of the invention, these electrostatic potentials are provided by making insert 30 of a ceramic composition which has the property of acquiring a negative charge to repel electrons, or of a metal which is negatively charged in any suitable manner to produce the same result.

The operation of a pump composed of a plurality of pumping cells according to the invention will now be described, with reference to the embodiments shown in FIGS. 1–3.

Initially, a substrate is placed in position in opening 6 and appropriate RF currents are supplied to coil 10 and the coil of plasma source 14 to establish plasmas in regions above and below partition wall 4. In addition, electric potentials are applied to appropriate components within the chamber to establish any desired electric fields. The generation of RF currents and application of electric potentials are based on principles and practices already known in the art.

Pump 18 is placed into operation and a negative potential is applied to each of cathodes 12. Processing gas is introduced via channels 38 and outlet holes 40 into the region between partition wall 4 and the substrate disposed in opening 6. When a suitable processing gas density has been established, a plasma will be formed and the desired processing operation will commence.

Referring now particularly to FIG. 2, the plasma which is formed in the region between partition wall 4 and the substrate will produce a supply of ions that will extend to a point close to the inlet, or lower, extremity of each conduit 22. In each pumping cell, an electric field will be established between the associated cone 34 and the plasma region below partition wall 4, the electric field lines extending through conduit 22.

The electric field between each cone 34 and the plasma region below partition wall 4 will serve to attract positive ions which are presently located in the plasma region in the vicinity of the inlet end of conduit 22 into conduit 22 and will accelerate these ions through conduit 22, guided by the magnetic field established within conduit 22 by the associated magnets 24. The configuration of this magnetic field will be influenced by the plasmas above and below partition wall 4.

The plasma produced by source 14 will provide a supply of free electrons above partition wall 4. These free electrons will diffuse around and past cathodes 12 to a point at which they can neutralize positive ions which have passed through, or are passing through, conduit 22. The free electrons that reach the region of each conduit 22 have the effect of neutralizing ions that may have become attached to the wall of conduit 22. Those ions which have passed through conduit 22 and have not been neutralized by the free electrons. will be attracted to the associated ion neutralization cone 34, where they will combine with electrons and thus become neutral gas molecules.

The flow of ions through each conduit 22 tends to reduce the pressure in the region below partition wall 4, while increasing the pressure in the region thereabove. The resulting higher pressure region extends to the inlet of pump 18 and because that region is at a comparatively high pressure, pump 18 can act efficiently to pump molecules out of that region and thus maintain the pressure in that region at a steady value.

At high neutral gas pressures, the accelerated ions may undergo charge exchange reactions in which they are neutralized by capturing an electron from an ambient gas molecule. In such a process, an escaping energetic ion is replaced by an ion whose energy is just that of the thermal gas molecules, and the local density of ions can rise in inverse proportion to the change in speeds of ions. The neutralized fast ion is no longer directed in flow velocity and resumes its full three-dimensional motion. A local positive space charge can then arise and result in a positive electrostatic field that further retards the outward flow of the ions. To prevent the development of any such positive space-charge fields, the present invention provides for means to inject additional free electrons, i.e. the plasma produced by source 14, whose presence neutralizes the thermal-ion cloud. It would be impractical to provide enough electron current to neutralize the entire stream of ions unless the electrons could be retained in the plasma conduits for times that are much longer than the transit time of ions through the conduits. The magnetic properties of the permanent magnet arrays provide the necessary mechanism for trapping the injected electrons magnetically, thereby permitting the necessary neutralization with practical levels of injected electron currents.

Annular cathodes 12 are connected to a negative potential source, or respective negative potential sources, in a manner to permit the potential on each annular cathode to be individually set. The desired control of the pumping action across of the surface of partition wall 4 can be achieved with annular cathodes, which are concentric with the axis of the processing chamber, in view of the generally axial symmetry of the plasma field created in the region between partition wall 4 and a substrate disposed in opening 6. On the other hand, various characteristics of the plasma field may vary in a radial direction and account can be taken of these variations by applying an individually selected potential to each of the annular cathodes 12.

In addition, cathodes 12 may be configured and connected in any other desired manner. For example, an independent, individually controlled cathode may be provided for each conduit 22. According to one possibility, this can be achieved by replacing each annular cathode 12 with a ring of insulating material carrying a plurality of individual cathodes each corresponding to a respective neutralizing cone 34. Each of these individual cathodes will be associated with a respective pumping cell and will be connected to a respective conductor which supplies an individually selected potential.

Since the plasma ions and electrons in the processing chamber below partition wall 4 are electrically charged, their motions are affected by the magnetic field through the Lorentz Force:

$$F=q(E+v\times B).$$

Here F is the force on a particle of electrical charge q, moving with a velocity v through electric, E, and magnetic, B, fields. The magnetic force is perpendicular both to the velocity, v, and the magnetic field, B. Whereas an electrically charged particle, such as an electron or an ion, can undergo full three-dimensional motion in the absence of both electric and magnetic fields, those fields cause such electrically charged particles to move along the magnetic field lines in an effective one-dimensional motion. The electrically charged particles move in spiral paths centered on the magnetic field lines and with radii equal to the gyroradius, $\rho$:

$$\rho = Mv_\perp/qB$$

Here M is the charged-particle mass, and $v_\perp$ is the component of particle velocity perpendicular to B. Thus, provided that the magnetic field is strong enough, charged particles can be magnetically guided through openings in suitably designed baffles, such as conduits 22 of the present invention.

Plasma ions will generally flow from the body of the plasma to the surface of partition wall 4 at the ion acoustic speed, $c_s$:

$$c_s = (2\,kT_e/M_i)^{1/2}$$

Here $kT_e$ is average kinetic energy of the plasma electrons and the ionic mass is $M_i$. Because the electrons are typically hotter than the neutral gas by roughly 100 times, $c_s$ can be 10 times greater than the thermal speed of the neutral gas molecules. For this reason, plasma ions can flow along magnetic fields through conduits 22 at much higher rates than the neutral gas molecules.

It is estimated that the focusing of ions by the magnetic field is itself responsible for a threefold increase in ion flow. This effect, combined with the above-stated value of $c_s$, suggests that the flow of ions through conduits 22 can be some 30 times greater than the neutral gas flow speed through the same orifices. The value of 30 represents the result of coarse calculations. The neutral gas flow speed is determined by a numerical calculation of the conductance of the conduit aperture with a given difference pressure. The difference pressure is the increased pressure, or the compression ratio, of the plasma pump. Ion flow through the conduit is calculated on the basis of estimates of the ability of the existing electric space charge to accelerate ions through the conduit.

There is an additional passive mechanism that may contribute to the plasma pumping process; namely, the compression of the plasma flow caused by the reduction of the cross sectional area of the flux tube formed by magnetic lines of force generated by magnets 24. Specifically, as the plasma flows toward the conduits 22, the magnetic field strength increases and the magnetic lines of force converge to a higher density. Plasma bound to these converging lines of force must also be compressed by an equal amount. Since the density of field lines is equal to the magnitude of the magnetic intensity, the compression ratio is just the ratio of the maximum magnetic field strength in the interior of the conduits 22 to the field strength at which the plasma ions can be considered to be bound to the lines of force, i.e. the ion gyroradius is smaller than the length characterizing the spatial gradients, $L_B$, in the magnetic field:

$$\rho < L_B = (dB/dz)^{-1}$$

where z is the direction of the axis of each conduit 22.

The electron gyroradius is typically much smaller than the ion gyroradius, which should therefore be used in this criterion. The consequences of these basic plasma pumping principles have been discussed in quantitative detail above in the description of a rudimentary idealized pump.

The flow of ions at the ion acoustic speed depends on the existence of a positive "ambipolar" potential that arises spontaneously to ensure that the body of the plasma is electrically neutral. This neutrality is maintained only if, on average, plasma electrons are lost from the body of the plasma at the same rate as plasma ions. Since the much more mobile electrons would otherwise leave the plasma at a far higher rate than the ions, a positive electrostatic potential well arises spontaneously that confines the electrons and reduces their loss rate from the plasma to a value equal to that of the ions. This positive potential is nearly constant throughout the body of the plasma, but decreases in a region (the "sheath") localized near the surface of the plasma. Ions arriving at this surface sheath are accelerated to the ion acoustic speed by the associated electrostatic field, which is created jointly by the field produced by cathode 12 and the existing electron space charge.

The pumping speed in each annular region of partition wall 4 will be a function of the negative potential in the associated annular cathode 12. An arrangement of the type shown in FIGS. 1–3 is capable of pumping a significant fraction, estimated to be generally greater than 30%, of the ion flux toward partition wall 4. This fraction, which represents pumping efficiency, can be calculated by comparing the quantity of ions pumped to the flux of ions reaching the surface of partition wall 4 by ambipolar diffusion. Any magnetic and electric fields which are generated by the pumping components and extending to the plasma volume below partition wall 4 will be negligibly small and thus have a negligible effect on the plasma assisted fabrication operation being performed in the processing chamber.

According to one exemplary, and non-limiting, practical embodiment of the invention, partition wall 4 can have a thickness of the order of 2.5 inches, each conduit 22 can have a diameter of 0.5 inches at its narrowest point, cathodes 12 can be located about 0.5 inch above the outlet ends of conduits 12, or the upper surface of partition wall 4, the potential on each cathode 12 can be of the order of 100v, and the plasma density in the outlet chamber can be $1\times 10^{12}$ ions/cm$^3$.

Figure 4:
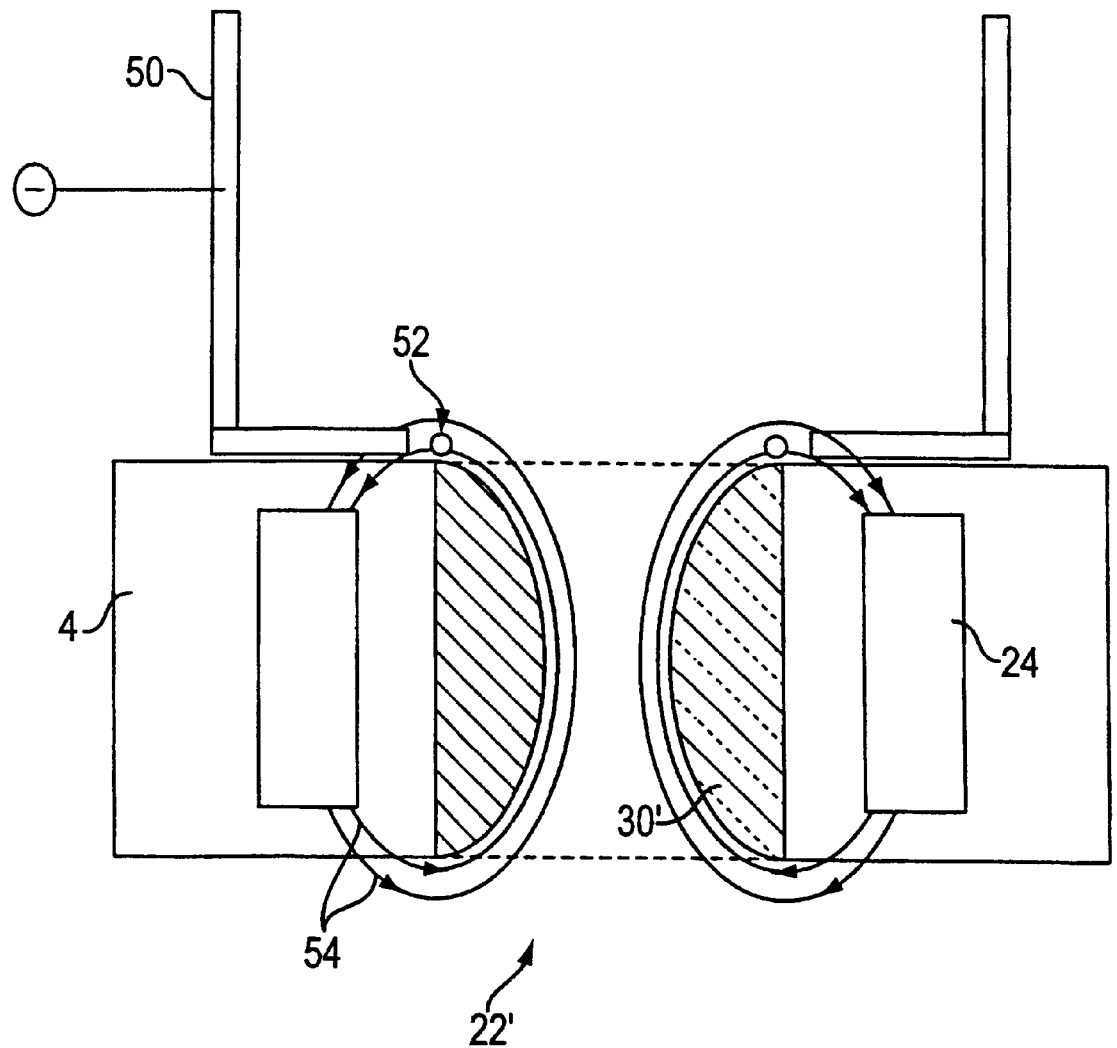
FIG. 4 is a cross-sectioned detail view of an alternative embodiment of a pumping cell according to the invention.

Referring now to FIG. 4, there is shown an alternative embodiment of a cell of a pump according to the invention in which the wall of conduit 22' has a curved, e.g., elliptical, form. The electric field for attracting ions through conduit 22' is created by applying a negative potential to a cylindrical electrode 50. Free electrons are supplied from a ring 52, which is negatively biased and heated to constitute a thermionic electron emitter. In a pump according to this embodiment, a plurality of cells having the form shown in FIG. 4 will be distributed across partition wall 4 in the manner shown in FIGS. 1–3.

The embodiment illustrated in FIG. 4 has the same arrangement of permanent magnets surrounded by cooling fluid passages and gas injection channels 38 and holes 40 as in the embodiment of FIGS. 1–3.

When the source of free, or neutralizing, electrons is a plasma, as opposed to a thermionic electron emitter, the plasma vacuum pump according to the invention can be used to pump chemically active materials which would react with, and chemically etch, the high temperature heated surface of a thermionic emitter. On the other hand, thermionic emitters can be less costly than systems for generating a plasma, and would thus be preferable for pumping species that would not adversely affect the high temperature heated surface of the thermionic emitter.

A plasma pump containing a plurality of cells according to the invention has a geometry which allows the cells to be placed relatively close to one another and to cover a large portion of the surface area of partition wall 4. The fact that adjacent cells share magnets enables cells to be disposed relatively close together.

In embodiments of apparatus according to the invention, pump 18 for pumping gas out of the region above partition wall 4 can be constituted by a backing pump system composed of a compound turbomolecular pump and a fore pump.

In an apparatus employing a plasma vacuum pump according to the invention, the pumping speed that can be achieved will be dependent on the surface area of the plasma vacuum pump. When the plasma region between partition wall 4 and a substrate is tapered in the manner shown in FIG. 1, the surface area of the plasma vacuum pump can be made relatively large compared to the surface areas being processed.

In an exemplary embodiment of apparatus having the form shown in FIG. 1, the diameter of the space enclosed by housing 2 at the level of a substrate, i.e., at the level of opening 6, is of the order of 33 cm, the diameter of the chamber at the level of partition wall 4 is of the order 53 cm, and the vertical height of the space between a substrate and partition wall 4 is of the order of 10.2 cm. The average diameter of the chamber in the region between partition wall 4 and opening 6 is approximately 43.2 cm. In this embodiment, the chamber in question has a volume of approximately 14.88 liters and the pumping surface defined by partition wall 4 has an area of the order of 223.46 $cm^2$. With a process pressure of 1 mT, a plasma density of the order of $1.5 \times 10^{12}$ ions/cc and an ion saturation current density of the order 0.035 $A/cm^2$, a maximum pumping speed of the order of $1.4 \times 10^4$ liters/sec can be achieved. The actual pumping speed will be the value mentioned above multiplied by the pumping efficiency. The average residence time of ions in the process chamber can be expressed as 0.0011 sec/efficiency.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A plasma pump for pumping ions from a first region containing a plasma to a second region when said plasma pump is interposed between the first region and the second region, said plasma pump comprising:

a partition member positionable between the first region and the second region, said partition member defining a plurality of conduits between the first and second regions;

a source of free electrons in communication with said conduits;

a plurality of groups of magnets, each said group being positioned relative to a respective one of said conduits in a manner to provide lines of magnetic force that extend through said respective one of said conduits; and a plurality of electric potential sources, each said source being disposed relative to a respective one of said conduits to create an electrostatic field which accelerates ions from said respective one of said conduits to the second region, wherein each of said conduits, together with a respective group of magnets and a respective electric potential source. forms a respective one of a plurality of pumping cells.

2. The pump according to claim 1 wherein:

said partition member has top and bottom walls which face the second region and first region, respectively, when said plasma pump is interposed between the first region and the second region;

each one of said conduits has a conduit wall which delimits a respective one of said conduits and extends between said top and bottom walls; and said group of magnets of each said pumping cell produces magnetic fields having lines of force that extend generally parallel to said conduit wall of a respective one of said conduits.

3. The pump according to claim 2 wherein said group of magnets of each said pumping cell is composed of permanent magnets which are sp aced apart around said respective one of said conduits and are oriented to have alternating magnetic polarities around said respective one of said conduits.

4. The pump according to claim 3 wherein each one of said conduits has a longitudinal center axis and the magnetic fields produced by said group of permanent magnets of each said pumping cell have a minimum intensity along the center axis.

5. The pump according to claim 2 wherein each said conduit wall has a generally convex form which gives said respective one of said conduits a minimum diameter in a plane parallel to, and interposed between, said top and bottom walls.

6. The pump according to claim 5 wherein each said conduit wall has a form defined by a trapezoid.

7. The pump according to claim 5 wherein each said conduit wall has a form defined by a smooth curve.

8. The pump according to claim 5 wherein said partition member comprises a body of an electrically conductive material and a plurality of ceramic inserts each surrounding a respective one of said conduits.

9. The pump according to claim 1 wherein said source of free electrons comprises a plasma.

10. The pump according to claim 1 wherein said source of free electrons comprises a thermionic electron emitter.

11. The pump according to claim 1 wherein each said electric potential source comprises a cathode element located in front of a respective one of said conduits and maintained at a negative potential.

12. The pump according to claim 1 wherein each of said groups of magnets includes at least one magnet which forms part of another one of said groups of magnets.

13. A plasma pump for pumping ions from a first region containing a plasma to a second region when said plasma pump is interposed between the first region and the second region, said plasma pump comprising:

partition means for separating the first region from the second region, said partition means defining a plurality of conduits between the first and second regions;

means for creating magnetic fields having magnetic lines of force that extend through the conduits for guiding ions through the conduits from the first region to the second region;

means for providing a supply of free electrons in the second region for neutralizing ions which are flowing through said conduits from said first region to said second region; and means for creating electric fields at locations to accelerate ions from within said conduits to the second region.

14. The pump according to claim 13 wherein:

said partition means comprise a partition member having top and bottom walls which face the second region and first region, respectively, when said pump is interposed between the first region and the second region; each of said conduits has a wall which delimits said conduit and extends between said top and bottom walls; and said means for creating magnetic fields comprise a plurality of groups of magnets producing magnetic fields having lines of force that extend generally parallel to said conduit walls.

15. The pump according to claim 14 wherein each of said groups of magnets is composed of permanent magnets which are spaced apart around a respective one of said conduits and are oriented to have alternating magnetic polarities around said respective one of said conduits.

16. The pump according to claim 15 wherein each of said conduits has a longitudinal center axis and the magnetic fields produced by each of said groups of permanent magnets have a minimum intensity along the center axis of a respective one of said conduits.

17. The pump according to claim 16 wherein each of said conduit walls has a generally convex form which gives said conduits a minimum diameter in a plane parallel to, and interposed between, said top and bottom walls.

18. The pump according to claim 17 wherein each of said conduit walls has a form defined by a trapezoid.

19. The pump according to claim 17 wherein each of said conduit walls has a form defined by a smooth curve.

20. The pump according to claim 17 wherein said partition member comprises a body of an electrically conductive material and a plurality of ceramic inserts each delimiting a respective one of said conduits.

21. The pump according to claim 14 wherein each of said groups of magnets includes at least one magnet which forms part of another one of said groups of magnets.

22. The pump according to claim 13 wherein said means for providing a supply of free electrons comprises a plasma.

23. The pump according to claim 13 wherein said means for providing a supply of free electrons comprises a thermionic electron emitter.

24. The pump according to claim 13 wherein said means for creating electric fields comprises a plurality of cathode elements each located in front of a respective one of said conduits and each maintained at a negative potential.

25. A method for pumping ions from a first region containing a plasma to a second region, said method comprising the steps of:

disposing a partition member between the first region and the second region, the partition member having a plurality of conduits which extend between, and communicate with, the first and second regions;

creating magnetic fields having magnetic lines of force that extend through the conduits for guiding ions through the conduits from the first region to the second region;

providing a supply of free electrons in the second region for neutralizing ions which are flowing through the conduits from the first region to the second region; and creating electric fields at locations to accelerate ions from within the conduits to the second region.

26. The method according to claim 25 wherein said step of creating electric fields comprises adjusting the intensity of the electric fields to control the rate of flow of ions through the conduit.

27. The method according to claim 26 wherein said step of adjusting the intensity of the electric fields comprises modulating the intensity of the electric fields in a periodic manner.

28. Apparatus for performing a plasma assisted fabrication procedure on a substrate, said apparatus comprising:

a housing enclosing a space having a first region and a second region, the housing defining a processing location at which the substrate is held during the fabrication procedure, the processing location being in the first region;

an output pump connected to said housing for pumping gas out of the second region; and a plasma pump for pumping ions from the first region to the second region, said plasma pump comprising:

a partition member positionable between the first region and the second region, said partition member defining a plurality of conduits between the first and second regions, a source of free electrons in communication with said conduits, a plurality of groups of magnets, each said group being positioned relative to a respective one of said conduits in a manner to provide lines of magnetic force that extend through said respective one of said conduits, and a plurality of electric potential sources, each said source being disposed relative to a respective one of said conduits to create an electrostatic field which accelerates ions from said respective one of said conduits to the second region, wherein each of said conduits, together with a respective group of magnets and a respective electric potential source, forms a respective one of a plurality of pumping cells.

29. The apparatus according to claim 28 wherein each of said groups of magnets includes at least one magnet which forms part of another one of said groups of magnets.

* * * * *